(12) United States Patent
Downs

(10) Patent No.: US 7,072,048 B2
(45) Date of Patent: Jul. 4, 2006

(54) INTERFEROMETRIC PLURAL-DIMENSIONAL DISPLACEMENT MEASURING SYSTEM

(75) Inventor: Michael John Downs, Liphook, NH (US)

(73) Assignee: Interferomet Limited, West Sussex (GB)

( * ) Notice: Subject to any disclaimer, the term of this patent is extended or adjusted under 35 U.S.C. 154(b) by 325 days.

(21) Appl. No.: 10/762,685

(22) Filed: Jan. 22, 2004

(65) Prior Publication Data

US 2004/0150833 A1 Aug. 5, 2004

(30) Foreign Application Priority Data

Jan. 24, 2003 (GB) ................ 0301644.1

(51) Int. Cl.
*G01B 9/02* (2006.01)
(52) U.S. Cl. .................... 356/500; 356/498
(58) Field of Classification Search ........ 356/500, 356/498, 487, 486, 493
See application file for complete search history.

(56) References Cited

U.S. PATENT DOCUMENTS

| 5,757,160 A | 5/1998 | Kreuzer |
| 5,801,832 A | 9/1998 | Van Den Brink |
| 5,828,456 A | 10/1998 | Aoki et al. |
| 6,678,056 B1 | 1/2004 | Downs |

*Primary Examiner*—Gregory Toatley
*Assistant Examiner*—Marissa J Detschel
(74) *Attorney, Agent, or Firm*—John V. Stewart

(57) ABSTRACT

A measuring system for an apparatus having a bed, a first stage movable in a first direction relative to the bed, and a second stage movable in a second direction at right angles to the first direction, relative to the first stage. A first interferometer measures displacement in the first direction between a first reference reflector and a first target reflector fixed to the first stage. A second interferometer (a) measures displacement in the second direction between a second reference reflector and a second target reflector fixed to the second stage, (b) includes an intermediate reflector fixed to the first stage, (c) produces a beam that extends in the first direction from a position fixed to the bed to the intermediate reflector and in the second direction from the intermediate reflector to the second target reflector and (d) can therefore have a head that is mounted on the bed.

11 Claims, 8 Drawing Sheets

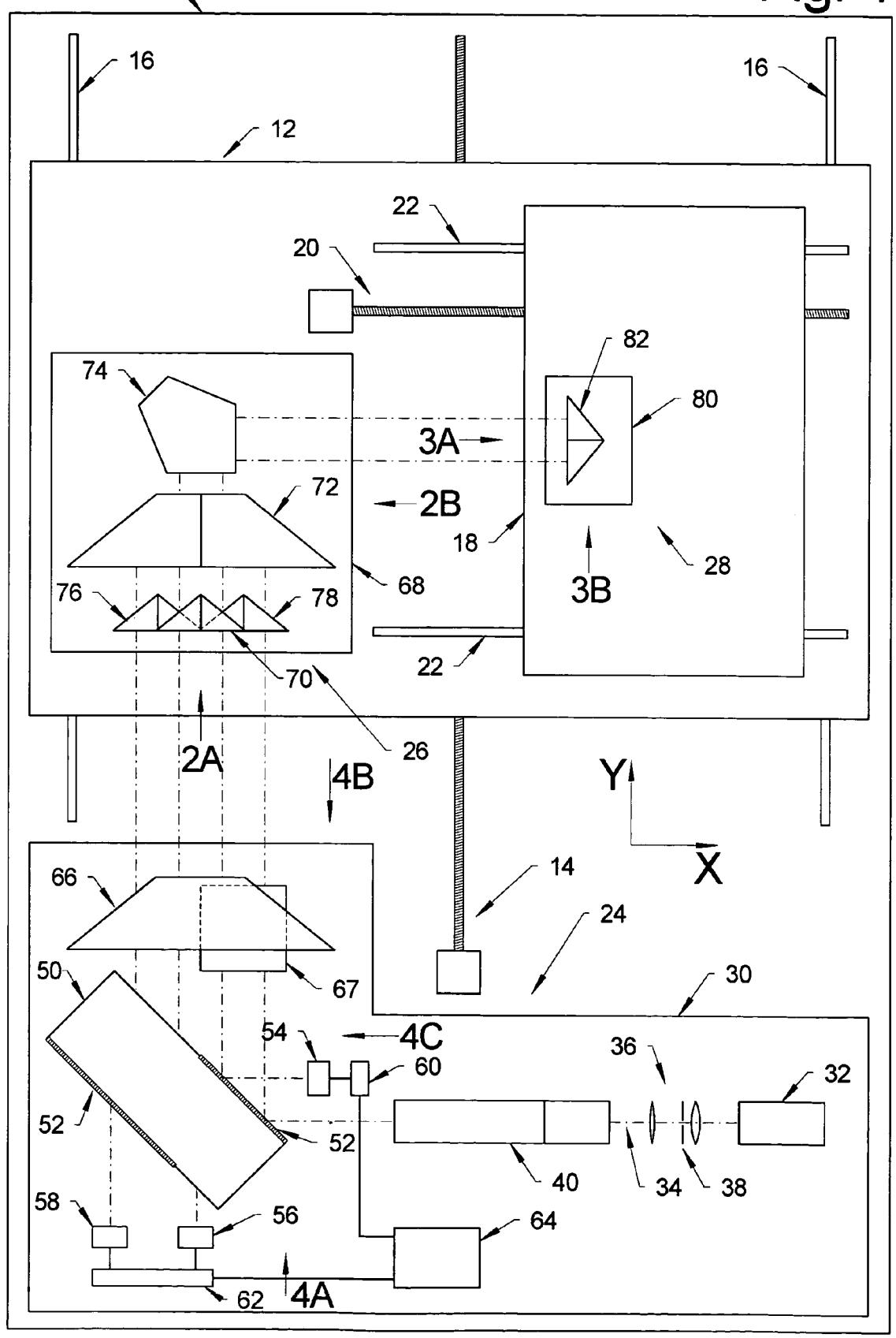

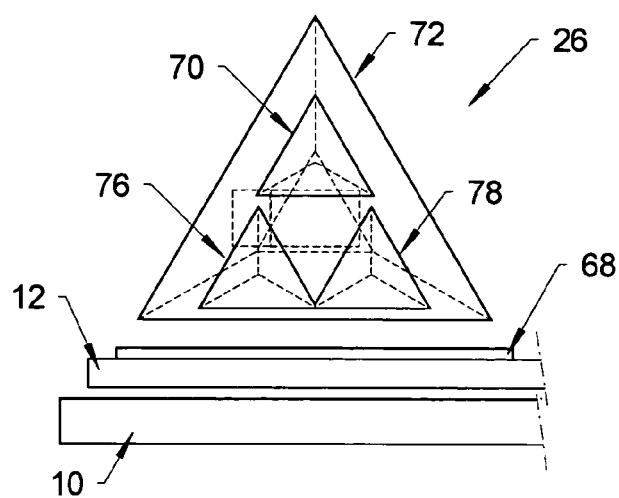
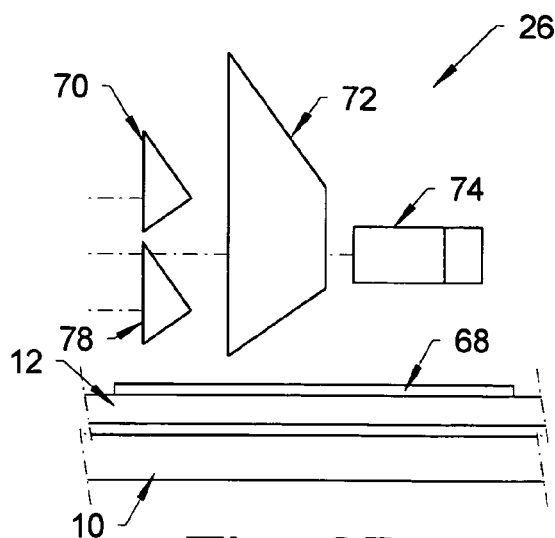
Fig. 2A
Fig. 2B
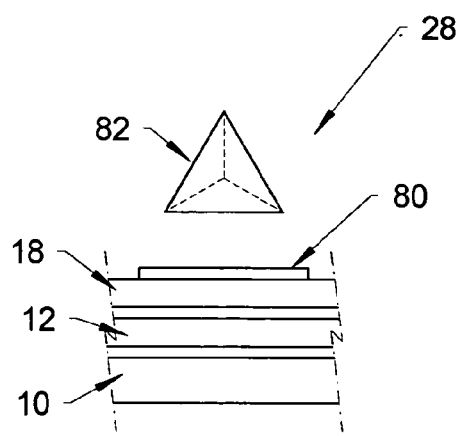
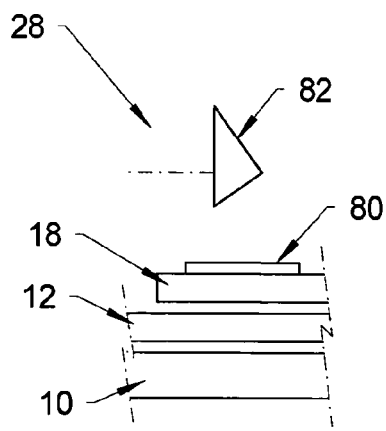
Fig. 3A
Fig. 3B

US 7,072,048 B2

INTERFEROMETRIC PLURAL-DIMENSIONAL DISPLACEMENT MEASURING SYSTEM

CROSS REFERENCE TO RELATED APPLICATIONS

This application claims the priority benefit of prior British patent application GB0301644.1, filed Jan. 24, 2003.

BACKGROUND TO THE INVENTION

1. Field of the Invention

This invention relates to a plural-dimensional displacement measuring system for an apparatus (such as a semiconductor or LCD manufacturing apparatus) having a bed, a first stage movable in a first direction (say Y) relative to the bed and a second stage movable in a second direction (say X), generally at right angles to the first Y direction, relative to the first stage.

2. Description of the Prior Art

In such an apparatus, the first and second stages are typically driven by respective electric motors that may be fitted with encoders in order to obtain a rough measure of the position of the second stage relative to the bed. However, semiconductor and LCD manufacture requires very high precision positioning, and in order to achieve this it is known to employ interferometers to measure the position, or displacement, of the second stage relative to the bed.

The invention relates, more particularly, to a measuring system employing a first interferometer system for measuring linear displacement generally in the first Y direction between a first reference reflector and a first target reflector fixed relative to the first stage and producing a corresponding first output signal, a second interferometer system for measuring linear displacement generally in the second X direction between a second reference reflector and a second target reflector fixed relative to the second stage and producing a corresponding second output signal, and means for processing the output signals to determine linear displacement of the second stage relative to the bed in the first and second directions, Such a measuring system is known. The first interferometer system includes a first interferometer head, having a first helium-neon (He-Ne) laser and the first reference reflector, mounted on the bed, and the second interferometer system includes a second interferometer head, having a second helium-neon (He-Ne) laser and the second reference reflector, mounted on the first stage. The requirement of mounting the second interferometer head, including its laser, on the first stage is a disadvantage, in view of the space required, the weight and the need to retrieve the second output signal from the second interferometer system.

SUMMARY OF THE INVENTION

The aim of the present invention, or at least specific embodiments of it, is to provide a measuring system that takes up less space on, and imposes less weight on, the movable first stage and that facilitates retrieval of the second output signal from the second interferometer system.

In accordance with a first aspect of the present invention, the displacement measuring system is characterised in that the second interferometer system includes an intermediate reflector fixed relative to the first stage and is arranged to produce a beam that extends generally in the first Y direction from a position fixed relative to the bed to the intermediate reflector and that, upon reflection thereby, extends generally in the second X direction from the intermediate reflector to the second target reflector. The second interferometer system can therefore have a head that is mounted on the bed, rather than on the first stage. In one embodiment, the second interferometer system need only have its intermediate reflector mounted on the first stage, although in another embodiment it may also have its reference reflector mounted thereon.

Preferably, the intermediate reflector comprises a pentaprism. This ensures that the angle of reflection (nominally a right angle) of the intermediate reflector is constant regardless (within limits) of the angle of incidence of the incident beam.

Varying yaw in the movement of the first stage relative to the bed can cause an error in the determined displacement in the first Y direction. The measuring system preferably employs a third interferometer system for measuring angular displacement of the first stage relative to bed and producing a corresponding third output signal. The third interferometer system preferably includes a pair of target reflectors and is arranged to produce a pair of beams that extend generally in the first Y direction from a position fixed relative to the bed to the pair of reflectors (for example as described in detail with reference to FIGS. 8, 9, 18 and 19 of patent document EP-A2-1180699). The processing means is preferably operable to take the third output signal, and more preferably also the second output signal, into account in determining the linear displacement of the second stage relative to the bed in the first Y direction.

Preferably, at least one of the interferometer systems is of the Jamin type employing a Jamin beam-splitting block for splitting a source beam into first and second projected beams and for combining reflections of the projected beams into a first interferogram beam and a second interferogram beam (for example as described with reference to FIG. 1 of patent document EP-A2-1180699). In this case, at least two of the interferometer systems are preferably of such Jamin type, employing different levels in a common such beam-splitting block. This has the advantage that one only Jamin beam-splitting block is required for the two or more interferometer systems.

The measuring system preferably further including means for producing a laser beam and a beam-splitter for splitting the laser beam into a plurality of source beams for at least two of the interferometer beam systems. This has the advantage that one only laser source is required for the two or more interferometer systems, resulting in considerable cost savings, especially when stabilised laser sources are used.

A second aspect of the invention provides a measuring system according to the first aspect of the invention, in combination with an apparatus having a bed, a first stage movable in a first Y direction relative to the bed and a second stage movable in a second X direction, generally at right angles to the first Y direction, relative to the first stage.

A third aspect of the invention relates to a method of setting up a measuring system according to the second aspect of the invention. In a known positioning apparatus having two separate interferometer systems, they are each set up so that their measuring directions are parallel to the respective directions of movement of the respective stages. However, the interferometer systems do not assist in ensuring that the direction of movement of the second stage relative to the first stage is orthogonal to the direction of movement of the first stage relative to the bed.

The method of the third aspect of the invention comprises the steps of: adjusting the orientation of the first interferometer system so that the measuring direction thereof is parallel to the direction of movement of the first stage relative to the bed; and adjusting the orientation of the first stage at a reference position so that the direction of movement of the second stage relative to the first stage at that reference position is parallel to the measuring direction of the second interferometer system. The orthogonality of the measuring directions of the first and second interferometer systems can be assured, for example using the pentaprism mentioned above. Therefore, by adjusting the parallelism of the measuring directions and the respective movement directions at the reference position, the orthogonality of the movement directions at least at the reference position can be assured. Any non-orthogonality of the movement directions at positions other than the reference position (due to variable yaw) can be accounted for in the manner mentioned above.

BRIEF DESCRIPTION OF THE DRAWINGS

FIG. 1 is a schematic plan view of a positioning apparatus having a displacement measuring system;

FIGS. 2A & 2B are views indicated by the arrows 2A and 2B respectively in FIG. 1 of one part of the displacement measuring system;

FIGS. 3A & 3B are views indicated by the arrows 3A and 3B respectively in FIG. 1 of another part of the displacement measuring system;

DETAILED DESCRIPTION OF THE PREFERRED EMBODIMENTS

Figure 4A:
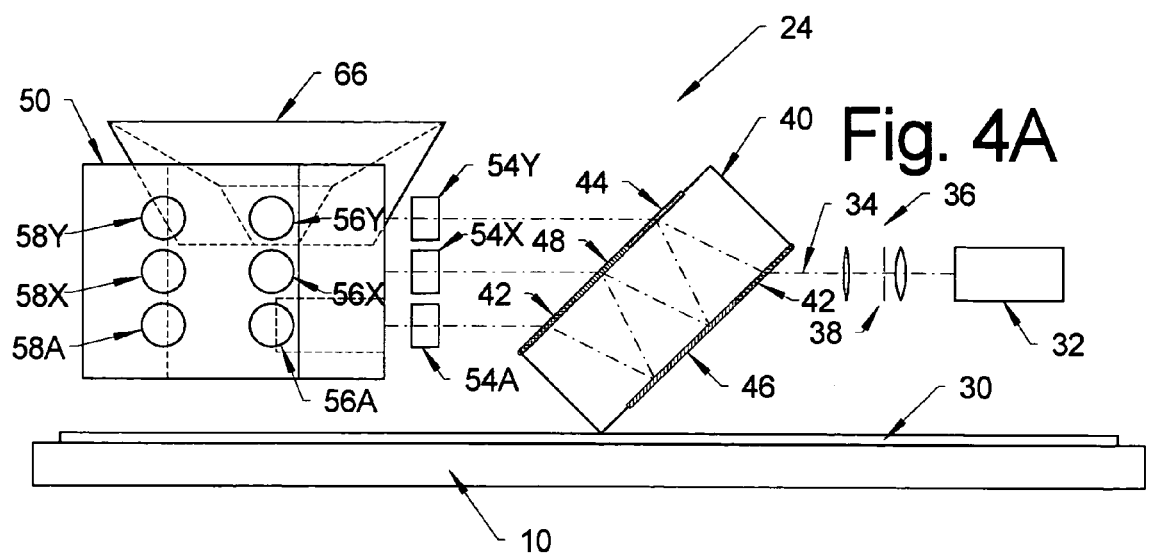
FIGS. 4A to 4C are views indicated by the arrows 4A to 4C respectively in FIG. 1 of a further part of the displacement measuring system.
Figure 4B:
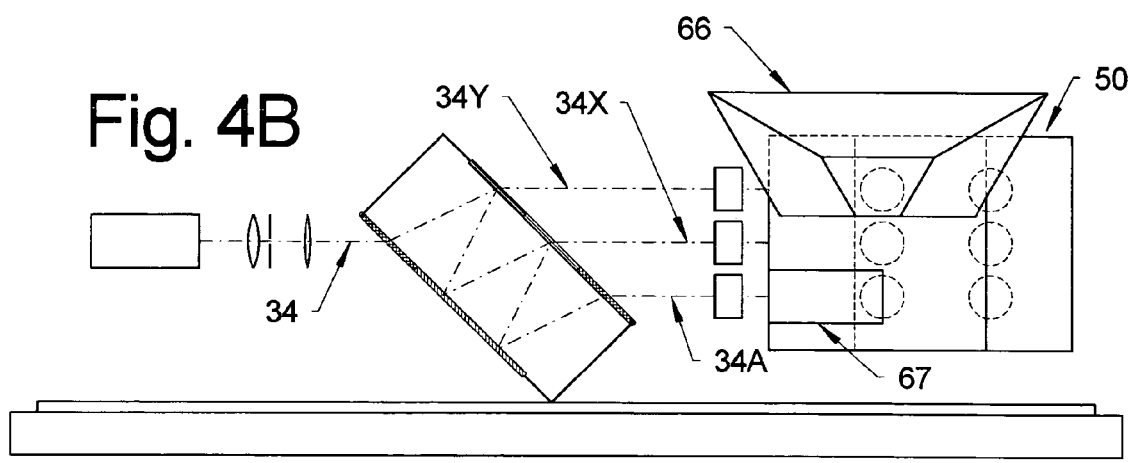
Figure 4C:
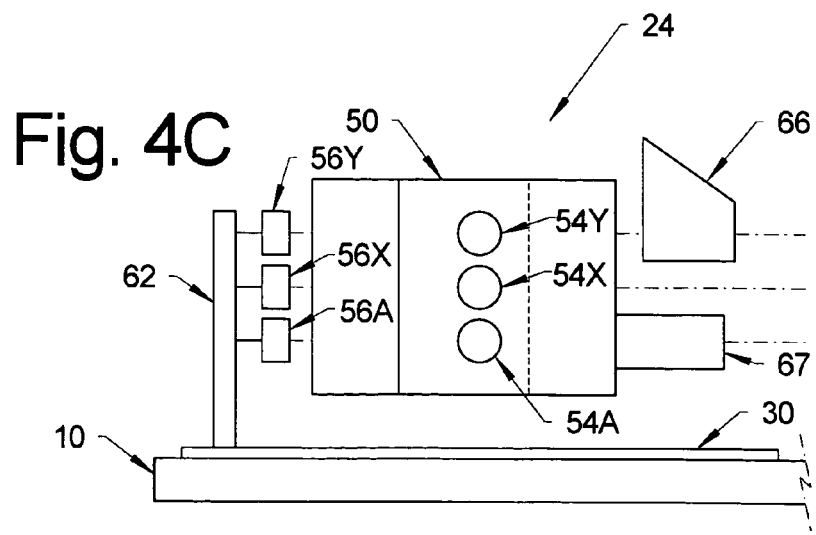

Referring to FIG. 1, a positioning apparatus comprises a bed 10, a Y-stage 12 mounted on the bed 10 for sliding movement along a pair of Y-ways 18 and driveable by a Y-motion 14 (represented simplistically by a motor and drive screw), and an X-stage 18 mounted on the Y-stage 12 for sliding movement along a pair of X-ways 22 and driveable by an X-motion 20 (again represented simplistically by a motor and drive screw). A probe or workpiece (not shown) can be mounted on the X-stage 18 and can be displaced in the mutually orthogonal X- and Y-directions, relative to the bed 10 by operation of the X- and Y-motions 14, 20. Some feedback as to the actual position of the X-stage 18 relative to the bed 10 can be provided by encoders in the X- and Y-motions 14, 20. However, this provides an insufficiently accurate indication of position. In order to obtain a more accurate indication of position, an interferometric displacement measuring system, as will now be described, is employed.

The interferometric displacement measuring system comprises a main module 24 fixed to the bed 10, a first reflector module 26 fixed to the Y-stage 12, and a second reflector module 28 fixed to the X-stage 18. As will be described in more detail below, laser beams are transmitted between the main module 24 and the first reflector module 26 in the Y-direction, and between the first reflector module 26 and the second reflector module 28 in the X-direction.

Referring particularly to FIGS. 1 and 4A to 4C, the main module 24 has a base plate 30 fixed to the bed 10 and on which the following components are statically mounted by mounting arrangements that are not shown for reasons of clarity. The first component is a stabilised He—Ne laser source 32 that produces a laser beam aligned in the X-direction. The laser beam has a nominal wavelength of 632.8 nm, an initial beam diameter of about 1 mm and a divergence of about 1 milliradian. The laser beam passes through a six-times beam-expander 36 formed by a pair of lenses with an apodising plate 38 at their common focus to produce a laser beam 34 having a divergence of about 0.1 second of arc or less. The laser beam 34 is divided by a beam-splitting block 40 (see particularly FIGS. 4A and 4B) into three parallel laser beams 34A,34X,34Y spaced apart in the vertical (or Z) direction. The beam splitting block 34 has a pair of mutually-parallel active faces that are inclined at 45° to the vertical. The laser beam 34 passes through an anti-reflection coating 42 on the entrance face to a ⅓ transmission: ⅔ reflection beam-splitting coating 44 on the exit face to produce the upper beam 34Y. The beam reflected by the coating 44 is also reflected by a mirror coating 46 on the entrance face back to a ½ transmission: ½ reflection beam-splitting coating 48 on the exit face to produce the middle beam 34X. The beam reflected by the coating 48 is also reflected by the mirror coating 46 on the entrance face back to an anti-reflection coating 42 on the exit face to produce the lower beam 34A. The three beams 34A,34X,34Y, which are therefore of substantially equal intensity, then fall on a Jamin-type interferometer beam-splitting block 50 having a pair of mutually-parallel active vertical faces that are inclined at 45° to the X- and Y-directions. Part of each active face is coated with a ½ transmission: ½ reflection beam-splitting coating 52. For further detail of the Jamin-type beam-splitting block 50, reference is directed to patent document EP-A2-1180699. As will be described in greater detail below, for each input beam 34A,34X,34Y, the beam-splitting block 50 (a) produces a respective pair of transmitted beams that are parallel in the Y-direction; (b) receives a respective pair of reflected beams that are parallel in the Y-direction; (c) produces from the respective pair of reflected beams a respective first interferogram beam in the X-direction that is detected by a respective photo-detector 54(A,X,Y); (d) produces from the respective pair of reflected beams a respective second interferogram beam in the Y-direction (in phase quadrature with the respective first interferogram beam) that is detected by a respective photo-detector 56(A,X,Y); and (e) produces a respective intensity-monitoring beam in the Y-direction that is detected by a respective photo-detector 58(A,X,Y). The signals from the photo-detectors 54,56,58 are amplified by preamplifiers 60,62 before being fed to a signal processor 64. As will be described in greater detail below, the main module 24 also includes a truncated cube-corner retroreflector 66 in the paths of the transmitted and reflected beams produced from the upper laser beam 34Y, and a dead-path compensating block 67 in the paths of one of the transmitted beams and one of the reflected beams produced from the lower laser beam 34A. As can be seen particularly in FIGS. 4B and 4C, the lower portion of the retroreflector 66 is cut away so as not to intercept the other transmitted and reflected beams.

Referring particularly to FIGS. 1, 2A and 2B, the first reflector module 26 has a base plate 68 fixed to the Y-stage 12 and on which the following components are statically mounted by mounting arrangements that are not shown for reasons of clarity. A cube-corner retroreflector 70 is mounted facing in the Y-direction towards the beam-splitting block 50 of the main module 24 and with its primary axis at the level of the upper laser beam 34Y. Behind the cube-corner retroreflector 70, a truncated cube-corner retroreflector 72 is mounted facing in the Y-direction towards the beam-splitting block 50 of the main module 24 and with its primary axis at the level of the middle laser beam 34X. Behind the retroreflector 72, a pentaprism 74 is mounted with one of its transmission faces facing in the Y-direction towards the beam-splitting block 50 of the main module 24 level with the middle laser beam 34X, and with its other orthogonal transmission face facing in the X-direction towards the second reflector module 28. In front of the retroreflector 72, a pair of cube-corner retroreflectors 76,78 are mounted side-by-side in the X-direction, facing in the Y-direction towards the beam-splitting block 50 of the main module 24 and with their primary axes at the level of the lower laser beam 34A.

Referring particularly to FIGS. 1, 3A and 3B, the second reflector module 28 has a base plate 80 fixed to the X-stage 18 and on which a cube-corner retroreflector 82 is statically mounted by a mounting arrangement that is not shown for reasons of clarity. The retroreflector 82 faces in the X-direction towards said other transmission face of the pentaprism 74 of the first reflector module 26 with its primary axis at the level of the middle laser beam 34X.

Figure 5A:
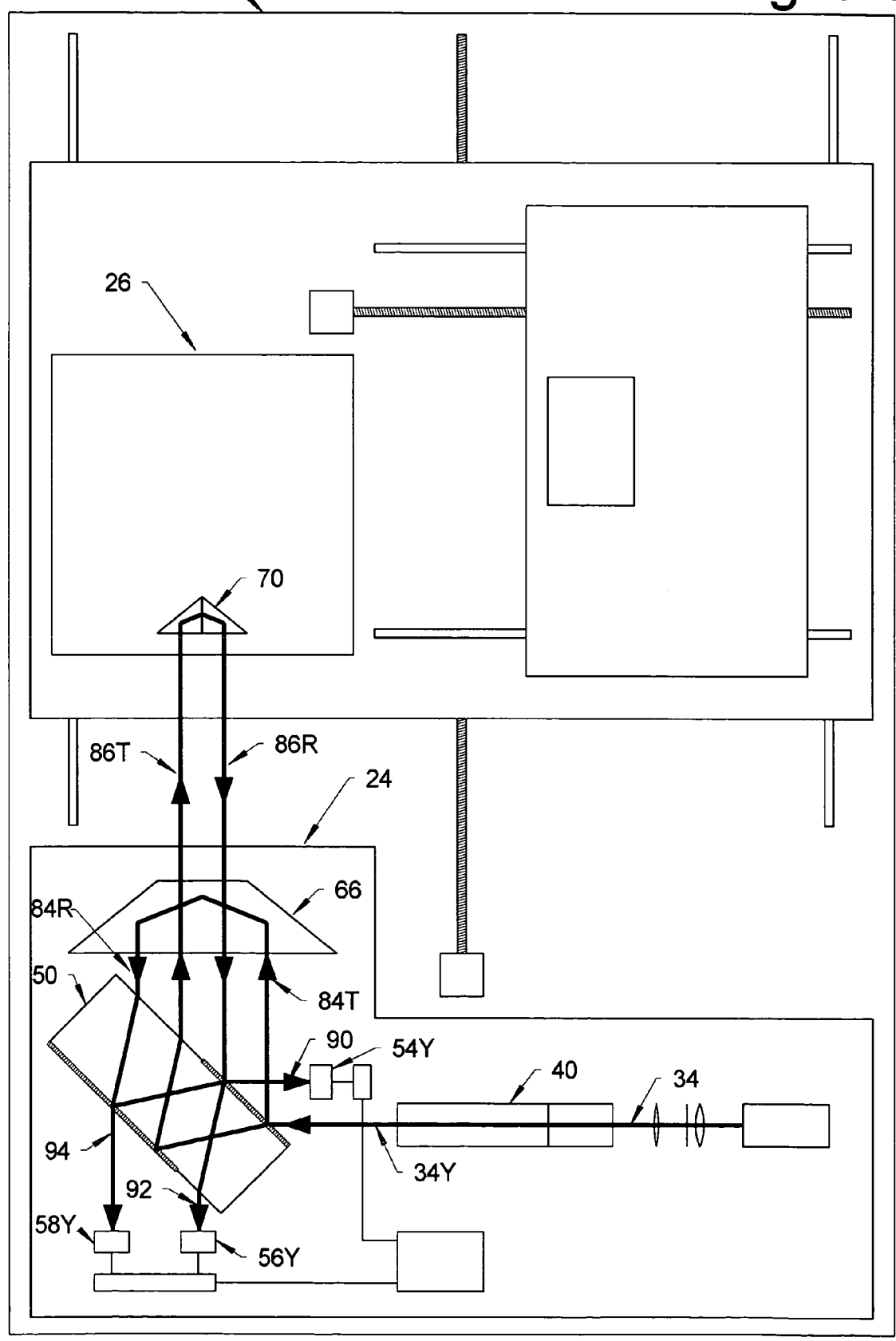
FIGS. 5A to 5C are simplified plan views of the apparatus of FIG. 1 illustrating the optical paths through the displacement measuring system at three different levels.

The optical paths through the displacement measuring system at the general level of the upper laser beam 34Y are shown by thick lines in FIG. 5A. The upper laser beam 34Y is split by the Jamin-type beam-splitting block 50 into two mutually-parallel beams 84T,86T transmitted in the Y-direction. One of the transmitted beams 84T is retroreflected by the truncated cube-corner retroreflector 66, acting as a reference reflector, on the main module 24 to form a reflected beam 84R that returns to the beam-splitting block 50. The other transmitted beam 86T passes through the centrally-transmitting portion of the retroreflector 66 and is retroreflected by the cube-corner retroreflector 70, acting as a target reflector, on the first reflector module 26 to form a reflected beam 86R that passes back through the centrally-transmitting portion of the retroreflector 66 and returns to the beam-splitting block 50. The beam-splitting block 50 combines the reflected beams 84R,86R to produce a first interferogram beam 90 that is detected by the photo-detector 54Y and a second interferogram beam 92 that is in phase quadrature with the first interferogram beam 90 and is detected by the photo-detector 56Y. From the teachings of patent document EP-A2-1180699, it will be appreciated that the signal processor 64 can determine, from the signals from the photo-detectors 54Y,56Y and the wavelength of the laser light (a constant), the amount and direction of linear displacement between the target retroreflector 70 and the reference retroreflector 66 in the direction of the beams 86T, 86R. The signal processor is arranged to do this and to produce a resultant signal or value "$Y_S$" that will be discussed below. Merely by detecting the fringes in the interferogram beams 90,92, it is possible to achieve a resolution of $Y_S$ of one eighth of a fringe, corresponding to 79 nm. However, if required, by employing the interpolation techniques discussed in EP-A2-1180699, it is possible to achieve a resolution of $Y_S$ of 10 nm or better.

Figure 5B:
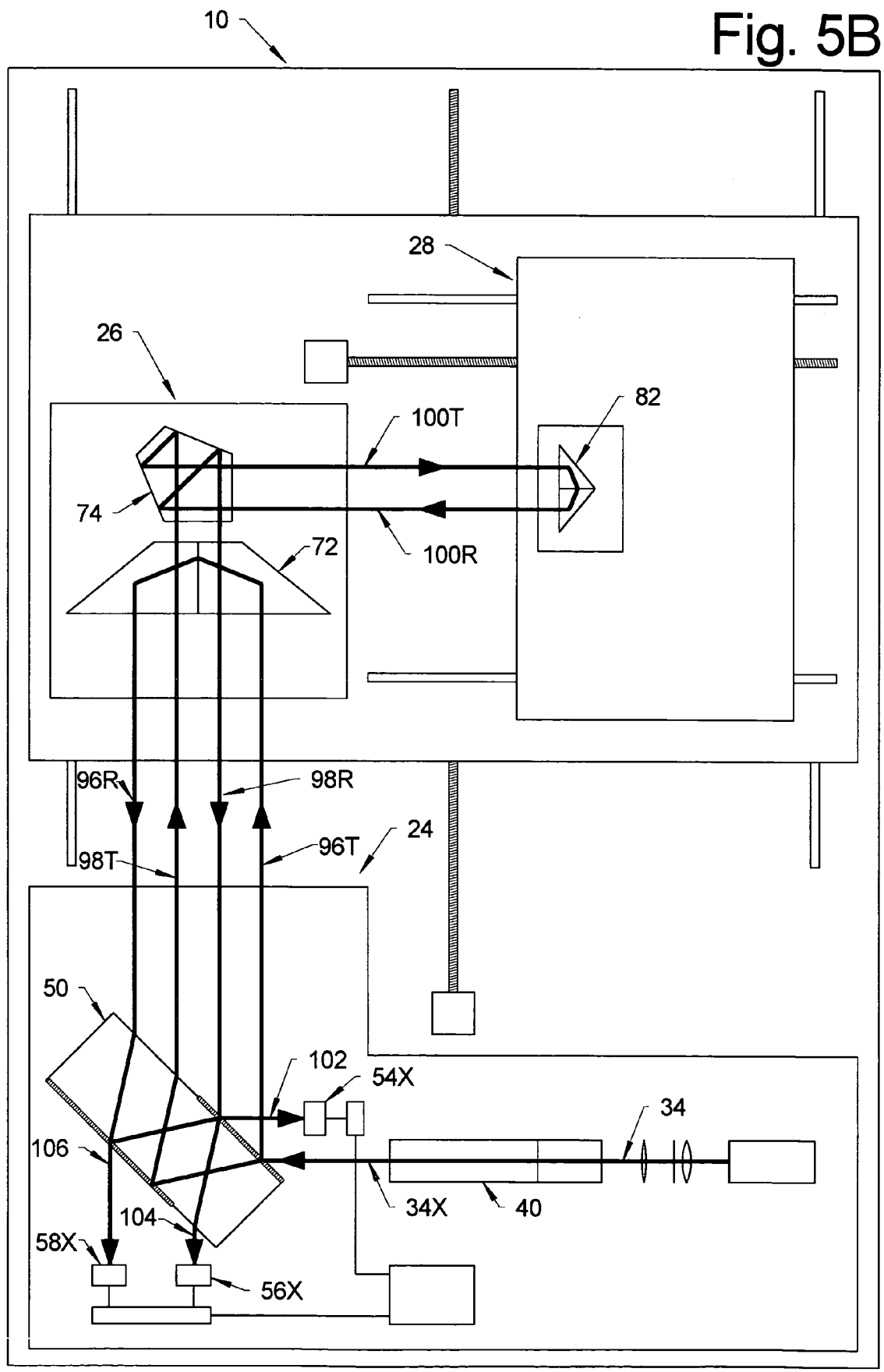

The optical paths through the displacement measuring system at the general level of the middle laser beam 34X are shown by thick lines in FIG. 5B. The middle laser beam 34X is split by the Jamin-type beam-splitting block 50 into two mutually-parallel beams 96T,98T transmitted in the Y-direction. One of the transmitted beams 96T is retroreflected by the truncated cube-corner retroreflector 72, acting as a reference reflector, on the first reflector module 26 to form a reflected beam 96R that returns to the beam-splitting block 50. The other transmitted beam 98T passes through the centrally-transmitting portion of the retroreflector 72 and falls on the pentaprism 74, which produces a beam 100T that is reflected at 90° to the beam 98T (i.e. in the X-direction) towards the cube-corner retroreflector 82, where the beam 100T is retroreflected by the cube-corner retroreflector 82, acting as a target reflector, on the second reflector module 28 to form a reflected beam 100T. The reflected beam 100T falls on the pentaprism 74, which produces a beam 98R at 90° to the beam 100T (i.e. in the Y-direction). The reflected beam 100T passes back through the centrally-transmitting portion of the retroreflector 72 and returns to the beam-splitting block 50. The beam-splitting block 50 combines the reflected beams 96R,98R to produce a first interferogram beam 102 that is detected by the photo-detector 54X and a second interferogram beam 104 that is in phase quadrature with the first interferogram beam 102 and is detected by the photo-detector 56X. From the teachings of patent document EP-A2-1180699, it will be appreciated that the signal processor 64 can determine, from the signals from the photo-detectors 54X,56X and the wavelength of the laser light (a constant), changes in the optical path length between the target retroreflector 82 and the reference retroreflector 72. Given that the optical path length between the reference retroreflector 72 and the pentaprism 74 is fixed and the path length through the pentaprism 74 is fixed, the signal processor 64 can therefore determine the amount and direction of linear displacement between the target retroreflector 82 and the pentaprism 74 in the direction of the beams 100T, 100R. The signal processor is arranged to do this and to produce a resultant signal or value "$X_S$" that will be discussed below. Again, merely by detecting the fringes in the interferogram beams 102,104, it is possible to achieve a resolution of $X_S$ of one eighth of a fringe, corresponding to 79 nm. However, if required, by employing the interpolation techniques discussed in EP-A2-1180699, it is possible to achieve a resolution of $X_S$ of 10 nm or better.

Figure 5C:
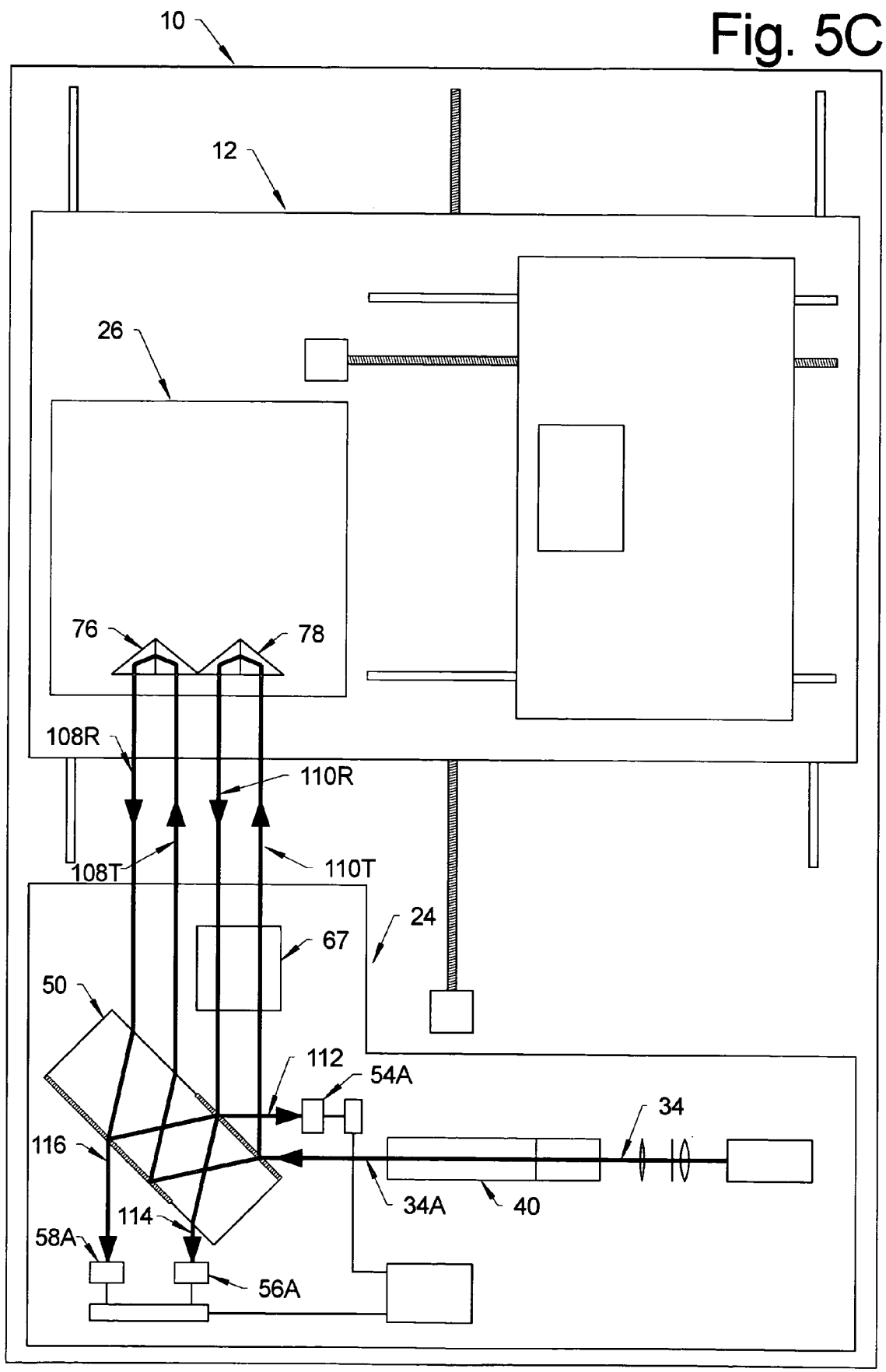

The optical paths through the displacement measuring system at the general level of the lower laser beam 34A are shown by thick lines in FIG. 5C. The lower laser beam 34A is split by the Jamin-type beam-splitting block 50 into two mutually-parallel beams 108T,110T transmitted in the Y-direction. One of the transmitted beams 108T is retroreflected by the left cube-corner retroreflector 76 on the first reflector module 26 to form a reflected beam 108R that returns to the beam-splitting block 50. The other transmitted beam 110T passes through the compensating block 67 and is retroreflected by the cube-corner retroreflector 78 on the first reflector module 26 to form a reflected beam 110R that passes back through the compensating block 67 and returns to the beam-splitting block 50. The beam-splitting block 50 combines the reflected beams 108R,110R to produce a first interferogram beam 112 that is detected by the photo-detector 54A and a second interferogram beam 114 that is in phase quadrature with the first interferogram beam 112 and is detected by the photo-detector 56A. From the teachings of patent document EP-A2-1180699, it will be appreciated that the signal processor 64 can determine, from the signals from the photo-detectors 54A,56A, the wavelength of the laser light (a constant) and the spacing between the beams 108T, 110T (a constant), the amount and direction of angular displacement of the retroreflectors 76,78, and therefore the amount and direction of angular displacement of the Y-stage 12 relative to the bed 10. The signal processor is arranged to do this and to produce a resultant signal or value "$A_S$" that will be discussed below. With a spacing between the apices of the retroreflectors 76,78 of 18.5 mm, merely by detecting the fringes in the interferogram beams 112,114, it is possible to achieve a resolution of $A_S$ of one eighth of a fringe, corresponding to 0.88 seconds of arc. However, if required, by employing the interpolation techniques discussed in EP-A2-1180699, it is possible to achieve a resolution of $A_S$ of 0.1 seconds of arc or better.

In a perfect system in which the Y-ways 16 and Y-stage 12 run perfectly straight and true without yaw and exactly parallel to the beams 86T,96T,98T, 108T,110T transmitted from the main module 24, in which the X-ways 22 and X-stage 18 run perfectly straight and true without yaw and exactly at right angles to the Y-ways 16 and Y-stage 12, and in which the pentaprism 74 produces a reflection of the beams 98T, 100T at an exact right angle, the position of the X-stage 18 relative to the bed 10 can be simply determined. The Y-motion 14 and X-motion 20 are adjusted to move the X-stage to a desired datum or origin position (0, 0). The signal processor 64 is arranged then to reset the current values $X_S$, $Y_S$ both to zero. When the Y-motion 14 and X-motion 20 are subsequently moved, the position (X, Y) of the X-stage 18 relative to the bed 10 is simply determined from (X, Y)=($X_S$, $Y_S$), in the common natural co-ordinate system of the positioning apparatus and the measuring system with the origin set at the datum position. If it is desired to move the X-stage 18 from a first position ($X_1$, $Y_1$) to a second position ($X_2$, $Y_2$) relative to the bed, it is then simply necessary to move the X-stage 18 a distance $X_2$-$X_1$ and to move the Y-stage 12 a distance $Y_2$-$Y_1$.

However, such systems are not perfect. Nevertheless, the measuring system described above can account for the main errors that may arise in practice. Any non-straightness of the Y- and X-ways 16,22 can introduce errors. However, such errors, if significant, are generally repeatable and compensation can be made for them in a manner described below. The main module 24 can be oriented on the bed 10 so that any non-parallelism between the beams projected by the main module 24 and the Y-ways 16 is insignificant. This can be done in a manner known per se in single interferometer measuring systems by temporarily placing a position sensitive photo-detector in the main module 24 in the path of the returned beam 86R and adjusting the orientation of the main module 24 relative to the bed 10 so that the position at which the returned beam 86R falls across the photo-detector is identical when the Y-stage 12 is at either end of its travel. The positioning apparatus and the measuring system can therefore be considered to have a common Y-axis. The pentaprism 74 may provide a constant angle of reflection that is not exactly 90°, but instead has an error that might typically be up to ±2 seconds of arc (so that the natural coordinate system of the measuring system is not orthogonal). However, the pentaprism error angle can be measured, and compensation may be made for the error, either mathematically or preferably by placing a thin wedged prism in the paths of the beams 100T, 100R, so that the X-axis of the measuring system can be considered to be orthogonal to its Y-axis. Variable yaw of the Y-stage 12 on the bed 10 (so that the natural coordinate system of the positioning apparatus is not, or does not remain, orthogonal) can introduce significant errors, but compensation is made for such errors by the initial set-up of the positioning apparatus and by using the value As. In the initial set-up of the apparatus, the Y-stage 12 is driven by the Y-motion 12 in a particular "set-up direction" (for example decreasing Y) to the Y origin position, Y=0. In a manner known per se in single interferometer measuring systems, a position sensitive photo-detector in the main module 24 is temporarily placed in the path of the returned beam 98R. The orientation of the Y-stage 12 relative to the bed 10 is then adjusted so that the position at which the returned beam 98R falls across the photo-detector is identical when the X-stage 18 is at either end of its travel. The yaw of the Y-stage 12 at the origin position is therefore set to zero, so that the X and Y axes of the positioning apparatus can be considered at the origin position to be mutually orthogonal and to be parallel to the mutually-orthogonal X and Y axes, respectively, of the measuring system. $A_S$ will be described below, compensation can be made for any subsequent variation in the yaw of the Y-stage 12 relative to the bed using the value $A_S$. Any variable yaw in the X-stage 18 relative to the Y-stage 12 will not cause any significant error in the 2-D measuring accuracy of the measuring system provided that the workpiece or probe that is mounted on the X-stage 18 is sufficiently close to the retroreflector 82 of the second reflector module 28.

Figure 6:
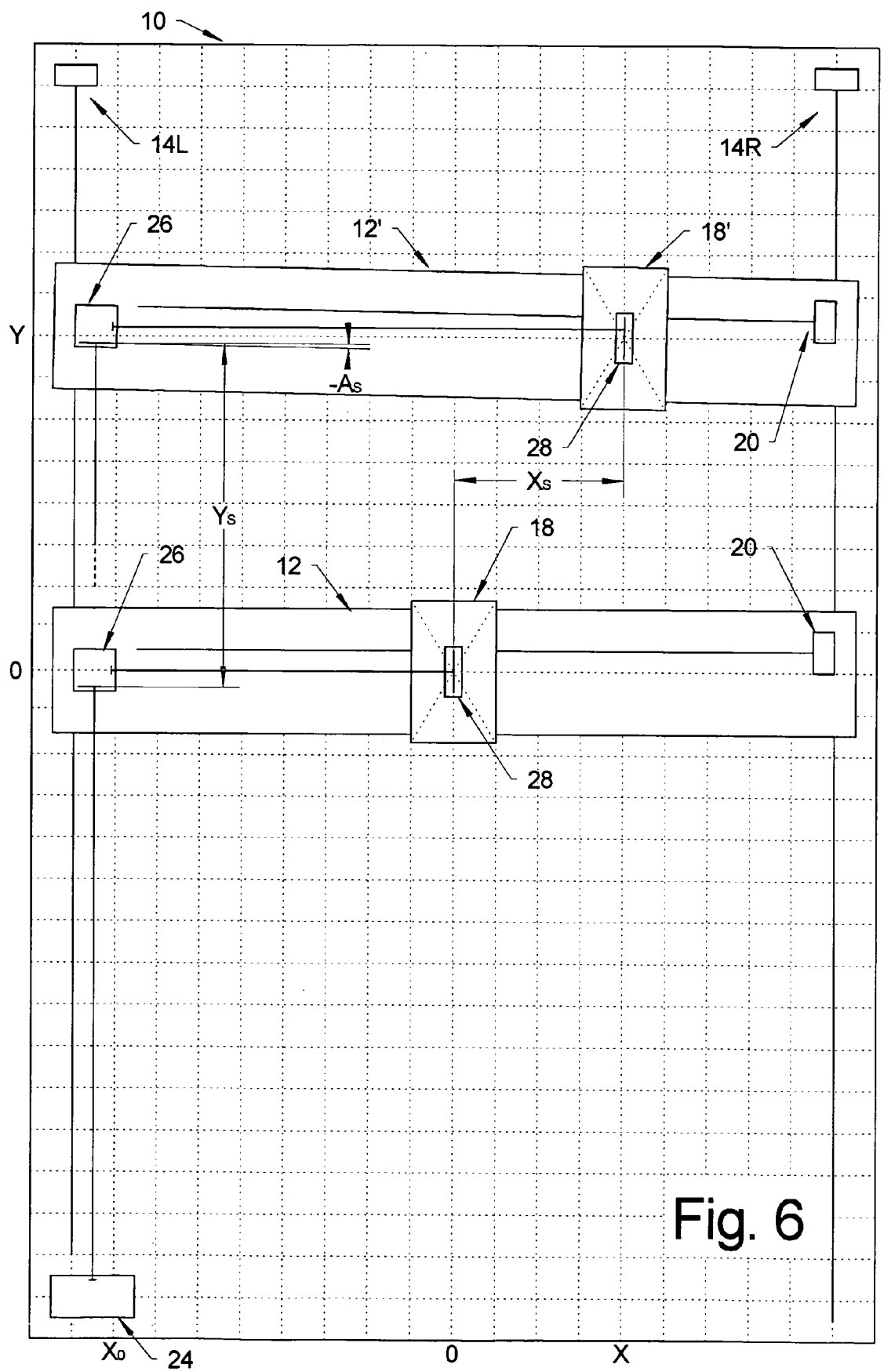
FIG. 6 is a schematic plan view of the displacement measuring system applied to a different form of positioning apparatus.

FIG. 6 shows a positioning apparatus that differs somewhat from the apparatus of FIG. 1, but that has an identical displacement measuring system. A pair of Y-ways and motions 14L,R extend along the left and right sides of the bed 10 to drive a Y-stage 12, in the form of a bridge, in the Y-direction. An X-way and motion 20 extends along the Y-stage 12 to drive an X-stage 18, in the form of a saddle, generally in the X-direction relative to the Y-stage 12. The main module 24, as described above, is fixed to the bottom-left corner of the bed 10 and is precisely oriented so that its projected beams are parallel to the Y-ways and motion 14L. The first reflector module 26, as described above, is fixed to the left end of the Y-stage 12 so as to receive the beams from the main module 24 and to transmit beams at an angle of 90° along the Y-stage 12. The second reflector module 28, as described above, is fixed to the X-stage 18 so as to receive the beams from the first reflector module 26.

At the start of operation of the system, and with the orthogonality and parallelism of the X and Y axes of the positioning apparatus and measuring system having been set up as described above, the Y-stage 12 is driven by the Y-motions 14L,R in the set-up direction, and the X-stage 18 is driven by the X-motion, to the datum position, indicated by the reference numerals 12 for the Y-stage and 18 for the X-stage, and the values $X_S$, $Y_S$, $A_S$ are each reset to zero. The datum position forms the origin (0, 0) for the position measuring system. When the positioning apparatus is subsequently moved to any other position, for example as indicated by the reference numerals 12' for the Y-stage and 18' for the X-stage and in which the Y-stage 12' is shown as having exaggerated negative yaw –$A_S$, the position (X, Y) of the X-stage 18' relative to the bed 10 is determined by the signal processor of the main module 24 by reading the current values $X_S$, $Y_S$, $A_S$ and performing the calculations:

$X=X_S$ and $Y=Y_S+(X_S-X_0).\tan A_S$ where $X_0$ is the X coordinate of the right face of the pentaprism 74, and which may be simplified to $Y=Y_S+(X_S-X_0).A_S$ for small $A_S$ (in radians).

In the case where the X-stage 18 is to be moved to a desired position ($X_D$, $Y_D$) relative to the bed, the error terms $Y_D$-Y and $X_D$-X may be used in the feedback loops for the Y- and X-motions 14L,14R,20.

As mentioned above, any non-straightness of the Y- and X-ways 16,22 can introduce errors. Non-straightness of the Y-ways 16 will produce errors in the X measurement, and non-straightness of the X-ways 22 will produce errors in the Y measurement. In order to compensate for such errors, mappings $X_E(Y)$ and $Y_E(X)$ of the non-straightness error of X as a function of Y and of the non-straightness error of Y as a function of X may be generated when the positioning apparatus and measuring system are initially set up using the same photo-detectors in the paths of the returned beams 86R,98R as are used for setting up the orthogonality and parallelism of the X and Y axes of the positioning apparatus and measuring system. With the mappings $X_E(Y)$ and $Y_E(X)$ arranged so that $X_E(0)=0$ and $Y_E(0)=0$, the calculations given above are then modified as follows:

$$X=X_S-X_E(Y)$$

and $$Y=Y_S+(X_S-X_0)\cdot A_S-Y_E(X).$$

Figure 7:
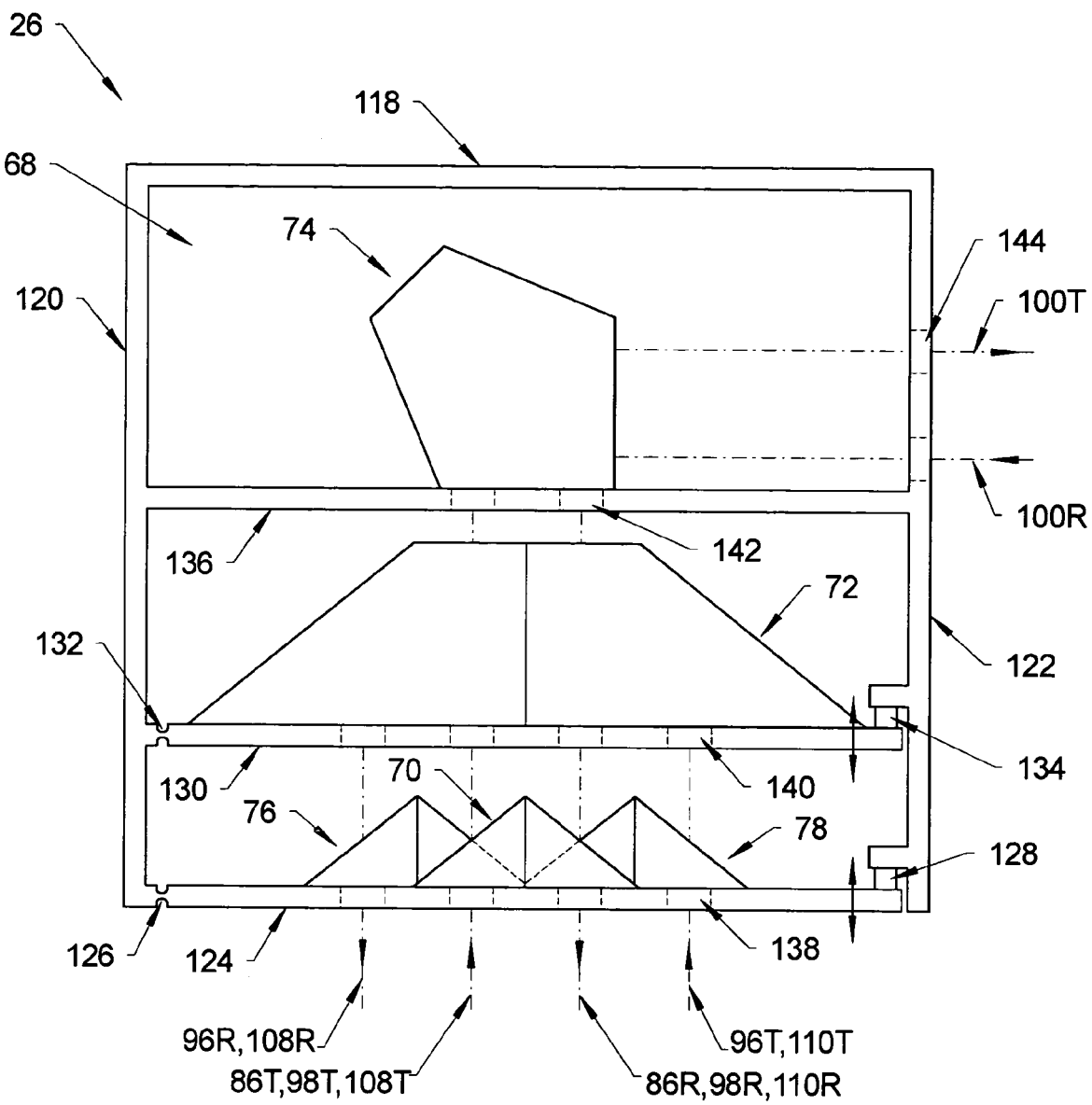
FIG. 7 is an enlarged plan view showing greater detail of part of the measuring system of FIG. 1.

Various modifications and developments may be made to the embodiment of the invention described above. For example, as described in patent document EP-A2-1180699, the path lengths of the two arms of each interferometer can advantageously be modulated in order to calibrate the interferometers. Such modulation can be effected using an arrangement for the first reflector module 26 as shown in FIG. 7. Rear, left and right walls 118,120,112 are rigidly mounted on the base plate 68. A front wall 124 extends between the front edges of the left and right walls 120,122. The left edge of the front wall 124 is hinged at 126 to the front edge of the left wall 120. The right edge of the front wall 124 is connected to the front edge of the right wall 144 by one or more stacks 128 of piezoelectric elements so that the front wall 124 will vibrate about the hinge 126 in response to an alternating voltage being applied to the piezoelectric stack 128. A first dividing wall 130 extends between the left and right walls 120,122, behind and parallel to the front wall 124. The left edge of the dividing wall 130 is hinged at 132 to the left wall 120. The right edge of the dividing wall 130 is connected to the right wall 144 by one or more stacks 134 of piezoelectric elements so that the dividing wall 130 will vibrate about the hinge 132 in response to an alternating voltage being applied to the piezoelectric stack 134. A second dividing wall 136 extends between the left and right walls 120,122, behind and parallel to the first dividing wall 130. The cube-corner reflectors 70,76,78 are bonded to the rear face of the front wall 124, and apertures 138 are formed in the front wall 124 to permit passage of the laser beams 86T,86R,96T,96R,98T,98R, 108T,108R, 110T, 110R. The truncated cube-corner reflector 72 is bonded to the rear face of the first dividing wall 130, and apertures 140 are formed in the first dividing wall 130 to permit passage of the laser beams 96T,96R,98T,98R. The pentaprism 74 is bonded to the rear face of the second dividing wall 136, and apertures 142 are formed in the second dividing wall 136 to permit passage of the laser beams 98T,98R. Apertures 144 are formed in the right wall 122 to permit passage of the laser beams 100T,100R. It will therefore be appreciated that operation of the piezoelectric stack 128, will modulate the path lengths of the beams 86T,86R relative to the beams 84T,84R in the "Y" interferometer, and will also modulate the path lengths of the beams 110T,110R relative to the beams 108T,108R in the "A" interferometer. Furthermore, operation of the piezoelectric stack 134, will modulate the path lengths of the beams 96T,96R relative to the beams 98T,100T,100R,98R in the "X" interferometer.

Although the reference reflector 72 for the "X" interferometer is described above as forming part of the first reflector module 26 and being mounted on the Y-stage 12, it may alternatively form part of the main module 24 and be mounted on the bed 10. In this case "X–Y" is substituted for "X" in the formulae mentioned above. Also, in this case, it may be possible to employ a single truncated cube-corner retroreflector for the Y reference reflector 66 and the X reference reflector 72, so that the triple interferometer requires only ten optically-transmitting components, namely (i) the beam expander 38, (ii) the three-way beam-splitting block 40, (iii) the Jamin beam-splitting block 50, (iv) the common X and Y reference reflector 66/72, (v) the Y target reflector 70, (vi) the pentaprism 74, (vii) the X target reflector 82, (viii) the left yaw reflector 76, (ix) the right yaw reflector 78 and (x) the compensating block 67.

Although the use of Jamin-type interferometers is preferred because of the lack of any need to use polarisation techniques in order to obtain the interferograms and because of the ease of alignment, other types of interferometer such as a Michelson interferometer may alternatively be used.

Although the measuring system described above combines three interferometers to measure principally X and Y displacements and yaw, in a simplified system in which yaw is insignificant, the yaw interferometer may be omitted. Furthermore, the system may be developed to include a further interferometer to measure Z displacement.

It should be noted that the embodiment of the invention has been described above purely by way of example and that many modifications and developments may be made thereto within the scope of the present invention.

What I claim is:

1. A plural-dimensional displacement measuring system for an apparatus having a bed (10), a first stage (12) movable in a first direction (Y) relative to the bed and a second stage (18) movable in a second direction (X), generally at right angles to the first direction, relative to the first stage, the measuring system employing a first interferometer system (FIG. 5A) for measuring linear displacement generally in the first direction between a first reference reflector (66) and a first target reflector (70) fixed relative to the first stage and producing a corresponding first output signal, a second interferometer system (FIG. 5B) for measuring linear displacement generally in the second direction between a second reference reflector (72) and a second target reflector (82) fixed relative to the second stage and producing a corresponding second output signal, and means (64) for processing the output signals to determine linear displacement of the second stage relative to the bed in the first and second directions, characterised in that:

the second interferometer system includes a intermediate reflector (74) fixed relative to the first stage and is arranged to produce a beam (98,100) that extends generally in the first direction from a position fixed relative to the bed to the intermediate reflector and that, upon reflection thereby, extends generally in the second direction from the intermediate reflector to the second target reflector.

2. A measuring system as claimed in claim 1, wherein the intermediate reflector comprises a pentaprism (74).

3. A measuring system as claimed in claim 1, and employing a third interferometer system (FIG. 5C) for measuring angular displacement of the first stage relative to bed and producing a corresponding third output signal.

4. A measuring system as claimed in claim 3, wherein the third interferometer system includes a pair of target reflectors (76,78) and is arranged to produce a pair of beams (108,110) that extend generally in the first direction from a position fixed relative to the bed to the pair of reflectors.

5. A measuring system as claimed in claim 3, wherein the processing means is operable to take the third output signal into account in determining the linear displacement of the second stage relative to the bed in the first direction.

6. A measuring system as claimed in claim 3, wherein the processing means is operable to take the second and third output signals into account in determining the linear displacement of the second stage relative to the bed in the first direction.

7. A measuring system as claimed in claim 1, wherein at least one of the interferometer systems is of the Jamin type employing a Jamin beam-splitting block (50) for splitting a source beam (34X;34Y;34A) into first and second projected beams (84,86;96,98;108,100) and for combining reflections of the projected beams into a first interferogram beam (90;102;112) and a second interferogram beam (92;104;114).

8. A measuring system as claimed in claim 7, wherein at least two of the interferometer systems are of such Jamin type, employing different levels in a common such beam-splitting block.

9. A measuring system as claimed in claim 1, further including a means (32) for producing a laser beam (34) and a beam-splitter (40) for splitting the laser beam into a plurality of source beams (34X,34Y,34A) for at least two of the interferometer beam systems.

10. A measuring system as claimed in claim 1, in combination with an apparatus having a bed (10), a first stage (12) movable in a first direction (Y) relative to the bed and a second stage (18) movable in a second direction (X), generally at right angles to the first direction, relative to the first stage.

11. A method of setting up a measuring system having a bed (10), a first stage (12) movable in a first direction (Y) relative to the bed, a second stage (18) movable in a second direction (X), generally at right angles to the first direction, relative to the first stage, and a plural-dimensional displacement measuring system employing a first interferometer system (FIG. 5A) for measuring linear displacement generally in the first direction between a first reference reflector (66) and a first target reflector (70) fixed relative to the first stage and producing a corresponding first output signal, a second interferometer system (FIG. 5B) for measuring linear displacement generally in the second direction between a second reference reflector (72) and a second target reflector (82) fixed relative to the second stage and producing a corresponding second output signal, and means (64) for processing the output signals to determine linear displacement of the second stage relative to the bed in the first and second directions, the second interferometer system including a intermediate reflector (74) fixed relative to the first stage and arranged to produce a beam (98,100) that extends generally in the first direction from a position fixed relative to the bed to the intermediate reflector and that, upon reflection thereby, extends generally in the second direction from the intermediate reflector to the second target reflector, the method comprising the steps of: adjusting the orientation of the first interferometer system so that the measuring direction thereof is parallel to the direction of movement of the first stage relative to the bed; and adjusting the orientation of the first stage at a reference position so that the direction of movement of the second stage relative to the first stage at that reference position is parallel to the measuring direction of the second interferometer system.

* * * * *